(12) United States Patent
Hatanaka et al.

(10) Patent No.: US 9,030,739 B2
(45) Date of Patent: May 12, 2015

(54) GARNET SINGLE CRYSTAL, OPTICAL ISOLATOR AND OPTICAL PROCESSOR (71) Applicants: Fujikura Ltd., Tokyo (JP); National Institute for Materials Science, Ibaraki (JP)

(72) Inventors: Tsubasa Hatanaka, Ibaraki (JP); Akiharu Funaki, Chiba (JP); Kiyoshi Shimamura, Ibaraki (JP); Villora Encarnacion Antonia Garcia, Ibaraki (JP)

(73) Assignees: Fujikura Ltd., Tokyo (JP); National Institute for Materials Science, Ibaraki (JP)

( * ) Notice: Subject to any disclaimer, the term of this patent is extended or adjusted under 35 U.S.C. 154(b) by 0 days.

(21) Appl. No.: 13/655,146

(22) Filed: Oct. 18, 2012

(65) Prior Publication Data
US 2013/0038927 A1 Feb. 14, 2013

Related U.S. Application Data (63) Continuation of application No. PCT/JP2011/059609, filed on Apr. 19, 2011.

(30) Foreign Application Priority Data

Apr. 20, 2010 (JP) .................. 2010-096568

(51) Int. Cl.
*G02B 27/28* (2006.01)
*C30B 29/28* (2006.01)
*G02F 1/09* (2006.01)
*H01F 1/34* (2006.01)
(Continued)

(52) U.S. Cl.
CPC .................. *C30B 29/28* (2013.01); *G02F 1/09* (2013.01);*G 02F 1/093* (2013.01); *H01F 1/346* (2013.01);
*G02B 27/286* (2013.01); *C30B 15/00* (2013.01); *G02F 1/0036* (2013.01)

(58) Field of Classification Search
CPC ...... C30B 15/00; C30B 29/28; G02B 27/286; G02F 1/0036; G02F 1/09; G02F 1/093; G02F 1/0955; H01F 1/346; H01S 5/0064; H01P 1/375
USPC ............. 359/483.01, 484.01, 484.02, 484.03, 359/484.04, 484.1, 352; 362/19; 353/20; 252/582, 585, 584; 372/703
See application file for complete search history.

(56) References Cited

U.S. PATENT DOCUMENTS 5,245,689 A * 9/1993 Gualtieri ........................ 385/142
5,528,415 A 6/1996 Gauthier et al.
(Continued)

FOREIGN PATENT DOCUMENTS

CN 1254747 A 5/2006
EP 2 492 379 A1 8/2012
(Continued)

OTHER PUBLICATIONS

Japanese Office Action issued Nov. 5, 2013 in Japanese Patent Application No. 2012-511664.
(Continued)

*Primary Examiner* — Stephone B Allen
*Assistant Examiner* — James McGee
(74) *Attorney, Agent, or Firm* — Sughrue Mion, PLLC (57) ABSTRACT The present invention provides a garnet single crystal comprising a terbium aluminum garnet single crystal, wherein a portion of the aluminum is substituted with scandium, and a portion of at least one of the aluminum and terbium is substituted with at least one type selected from the group consisting of thulium, ytterbium and yttrium.

7 Claims, 3 Drawing Sheets (51) Int. Cl.
*C30B 15/00* (2006.01)
*G02F 1/00* (2006.01)

(56) References Cited

U.S. PATENT DOCUMENTS

| | | | |
|---|---|---|---|
| 7,592,281 B2 * | 9/2009 | Tang et al. | 501/152 |
| 2010/0294939 A1 * | 11/2010 | Kuntz et al. | 250/361 R |

FOREIGN PATENT DOCUMENTS

| | | |
|---|---|---|
| JP | 8-12498 A | 1/1996 |
| JP | 9-68675 A | 3/1997 |
| JP | 2001-226196 A | 8/2001 |
| JP | 2002-293693 A | 10/2002 |
| JP | 4428387 B2 | 3/2010 |
| WO | 92/21996 A1 | 12/1992 |
| WO | 2006/013673 A1 | 2/2006 |

OTHER PUBLICATIONS

Extended Search Report in corresponding European Patent Application No. 117720037 dated Jul. 26, 2013.

Office Action issued in corresponding Canadian Application No. 2,797,012 dated Sep. 3, 2013.

* cited by examiner

GARNET SINGLE CRYSTAL, OPTICAL ISOLATOR AND OPTICAL PROCESSOR

CROSS REFERENCE TO RELATED APPLICATIONS

This application is a Continuation of National Stage of International Application No. PCT/JP2011/059609 filed Apr. 19, 2011, claiming priority based on Japanese Patent Application No. 2010-096568 filed Apr. 20, 2010, the contents of all of which are incorporated herein by reference in their entirety.

TECHNICAL FIELD

The present invention relates to a garnet single crystal, an optical isolator and an optical processor.

BACKGROUND ART

Accompanying the proliferation of optical communications using optic fiber cables and laser processors for precision processing in recent years, various types of lasers used as their light sources are expected to have increasingly higher outputs in the future. Along with this trend, response to stabilization of these light sources and prevention of their destruction are becoming increasingly important. Optical isolators are used as devices responsible for the stabilization of the light sources and prevention of their destruction.

Optical isolators are equipped with a Faraday rotator that rotates the polarization plane of incident light in response to application of a magnetic field. Yttrium iron garnet has conventionally been used as Faraday rotators for optical communication applications. However, yttrium iron garnet has the shortcomings of being susceptible to deterioration of thin film single crystal due to increased output of the light source, as well as restrictions on the wavelength bands in which it can be used due to its narrow bandwidth in which light is transmitted. In view of these circumstances, a terbium aluminum garnet single crystal has been developed that demonstrates high optical transmittance over a broad wavelength range of 400 nm to 1500 nm while also demonstrating a large Faraday rotation angle (Patent Document 1), and this single crystal is expected to be used as a Faraday rotator for optical isolators. This single crystal is represented by the general formula indicated below:

$(Tb_{3-x}Sc_x)Sc_2Al_3O_{12}$ (0.1≤x<0.3).

PRIOR ART DOCUMENTS

Patent Documents

Patent Document 1: Japanese Patent Application Laid-open No. 2002-293693

SUMMARY OF THE INVENTION

However, the garnet single crystal described in the above-mentioned Patent Document 1 had the problems indicated below.

Namely, Faraday rotators are obtained by cutting out a single crystal obtained by crystal growth to a desired shape. However, in the case of the single crystal described in Patent Document 1, there was the problem of cracks forming during that cutting thereby preventing the realization of a single crystal of good quality. Here, it is also possible to cut out only a portion where cracks have not formed. However, even in the case of cutting out a portion where cracks have not formed, there was still the risk of the cracks spreading. Consequently, the single crystal described in Patent Document 1 cannot be said to be suitable for volume production or have adequate practicality.

Consequently, a single crystal was sought that has high optical transmittance over a broad wavelength range and has a large Faraday rotation angle without being susceptible to the formation of cracks.

With the foregoing in view, an object of the present invention is to provide a garnet single crystal of good quality that has high optical transmittance over a broad wavelength range and has a large Faraday rotation angle, an optical isolator and an optical processor.

Means for Solving the Problems

The inventors of the present invention conducted extensive studies to solve the above-mentioned problems. As a result, the inventors of the present invention surmised that the above-mentioned problems occur for the reasons indicated below. Namely, in the above-mentioned single crystal, stabilization is attempted to be achieved by substituting six-coordinate aluminum (hereinafter it can be abbreviated as "Al") with scandium (hereinafter it can be abbreviated as "Sc"). However, the inventors of the present invention thought that, since the stabilizing effect thereof was still inadequate, strain occurs within the single crystal, causing the formation of cracks as a result thereof. As a result of conducting further extensive studies, the inventors of the present invention found that the above-mentioned problems can be solved by not only substituting a portion of the Al in a terbium aluminum garnet single crystal with Sc, but also by substituting a portion of at least one of the terbium (hereinafter it can be abbreviated as "Tb") and Al with thulium (hereinafter it can be abbreviated as "Tm"), ytterbium (hereinafter it can be abbreviated as "Yb") or yttrium (hereinafter it can be abbreviated as "Y"), thereby leading to completion of the present invention.

Namely, the present invention is a garnet single crystal comprising a terbium aluminum garnet single crystal, wherein a portion of the aluminum is substituted with scandium, and a portion of at least one of the aluminum and terbium is substituted with at least one type selected from the group consisting of thulium, ytterbium and yttrium.

According to this invention, cracks can be adequately inhibited and a single crystal of good quality can be realized. Consequently, the garnet single crystal of the present invention is suitable for volume production and has adequate practicality. In addition, according to the present invention, a garnet single crystal can be realized that has high optical transmittance and has a large Faraday rotation angle over a broad wavelength range (400 nm to 1500 nm).

The inventors of the present invention have hypothesized the following reasons for the absence of crack formation as described above. Basically, as a result of substituting a portion of six-coordinate Al with Tm, Yb or Y having an ion radius slightly larger than that of Sc or substituting a portion of eight-coordinate Tb with Tm, Yb or Y having an ion radius smaller than that of Tb, ion radius within the single crystal becomes favorably balanced and the garnet structure becomes stable. As a result, the inventors of the present invention surmised that the generation of strain in the single crystal is adequately inhibited, thereby resulting in less likelihood of the formation of cracks in the single crystal. In addition, the inventors of the present invention presume that the reason for the garnet single crystal of the present invention having high optical transmittance and demonstrating a large Faraday rotation angle over a broad wavelength range (400 nm to 1500 nm) is as indicated below. Namely, the garnet single crystal of the present invention shares a common crystal type with the terbium aluminum garnet single crystal of Patent Document 1 that has high optical transmittance and demonstrates a large Faraday rotation angle over a broad wavelength range of 400 nm to 1500 nm, and the elements that compose the garnet single crystal are also in common with the single crystal of Patent Document 1 with the exception of a portion of Tb and a portion of Al being substituted with Tm, Yb or Y. Consequently, the inventors of the present invention presume that this is why the garnet single crystal of the present invention has high optical transmittance and demonstrates a large Faraday rotation angle over a broad wavelength range.

In addition, in the above-mentioned garnet single crystal, portions of the aluminum and the terbium are each preferably further substituted with at least one type selected from the group consisting of thulium, ytterbium and yttrium.

In this case, the garnet structure becomes more stable in comparison with the case of only a portion of either the aluminum or the terbium being substituted with at least one type selected from the group consisting of thulium, ytterbium and yttrium.

In addition, in the above-mentioned garnet single crystal, the terbium is preferably further substituted with scandium.

In this case, the garnet structure becomes more stable by substituting Tb with scandium in comparison with the case of terbium not being substituted with scandium.

Moreover, the above-mentioned garnet single crystal is preferably represented by the following general formula:

$(Tb_{3-x-z}Sc_zM_x)(Sc_{2-y}M_y)Al_3O_{12}$      (1)

(wherein, M represents at least one type selected from the group consisting of Tm, Yb and Y, and x, y and z satisfy the following formula:

$0<x+y\leq0.30$, and $0\leq z\leq 0.30$).

According to this invention, the formation of cracks can be effectively inhibited and a single crystal of better quality can be realized. Consequently, the garnet single crystal of the present invention is suitable for volume production and has adequate practicality. In addition, according to the present invention, a garnet single crystal can be realized that has higher optical transmittance and demonstrates a larger Faraday rotation angle over a broad wavelength range (400 nm to 1500 nm).

In the above-mentioned general formula (1), x and y preferably satisfy the following formula simultaneously:

$0\leq x\leq 0.30$ $0\leq y\leq 0.30$ $x<y$.

In this case, the garnet structure becomes more stable.

In addition, in the above-mentioned general formula (1), z preferably simultaneously satisfies the following formula:

$0<z\leq 0.05$.

In this case, the garnet structure becomes more stable.

In addition, in the above-mentioned general formula (1), x and z preferably simultaneously satisfy the following formula:

$x>z$.

In this case, the garnet structure becomes more stable.

Moreover, the garnet single crystal of the present invention is preferably used as a Faraday rotator.

In addition, the present invention is an optical isolator having a Faraday rotator, wherein the Faraday rotator is formed of the above-mentioned garnet single crystal.

According to this optical isolator, the above-mentioned single crystal having high optical transmittance over a broad wavelength range is used as a Faraday rotator. Consequently, absorption of light attributable to the single crystal is reduced. Consequently, resistance to damage caused by light of the Faraday rotator can also be enhanced. Moreover, since the above-mentioned single crystal has a large Faraday rotation angle, in the case of causing rotation of the polarization plane of light by applying a constant magnetic field to the above-mentioned single crystal, the length of the Faraday rotator along the direction in which the light progresses can be reduced, thereby making it possible to realize reduced size of the optical isolator. Moreover, since the above-mentioned single crystal used as a Faraday rotator is free of the formation of cracks, the frequency of the formation of cracks during handling is extremely low. Consequently, the service life of the optical isolator can be prolonged.

Moreover, the present invention is an optical processor provided with a laser light source, and an optical isolator arranged in a light path of laser light emitted from the laser light source, wherein the optical isolator is the above-mentioned optical isolator.

In this optical processor, a garnet single crystal having high optical transmittance over a broad wavelength range (400 nm to 1500 nm) is used as a garnet single crystal used for the Faraday rotator of the optical isolator. Consequently, decreases in optical output from the laser light source can be adequately inhibited. In addition, absorption of light attributable to the single crystal is low due to the high optical transmittance of the single crystal. Consequently, resistance to damage caused by light of the optical isolator can also be enhanced. Moreover, since the above-mentioned single crystal has high optical transmittance over a broad wavelength range, light sources of various oscillation wavelengths can be used for the laser light source used. Moreover, the above-mentioned garnet single crystal has a large Faraday rotation angle at each wavelength over a broad wavelength range (400 nm to 1500 nm). Consequently, in the case of causing to rotate the polarization plane of light by applying a constant magnetic field to the single crystal, the length of the optical isolator along the direction in which light progresses can be reduced, thereby making it possible to realize reduced size of the optical isolator. Thus, reduced size of the optical processor can also be realized.

Moreover, since the formation of cracks is adequately inhibited in the above-mentioned single crystal used in the optical isolator, the frequency of the formation of cracks during handling is extremely low. Consequently, the service life of the optical isolator can be prolonged. As a result, the frequency at which the optical isolator is replaced in the optical processor can be reduced.

Here, the oscillation wavelength of the above-mentioned laser light source is preferably 1064 nm. This is because, since the garnet single crystal of the present invention has high optical transmittance particularly at a wavelength of 1064 nm, absorption of laser light from the laser light source can be made to be adequately low in the garnet single crystal.

Effects of the Invention

According to the present invention, a garnet single crystal, in which the formation of cracks is adequately inhibited while having high optical transmittance and having a large Faraday rotation angle over a broad wavelength range, an optical isolator and an optical processor are provided.

MODE FOR CARRYING OUT THE INVENTION

The following provides a detailed explanation of embodiments of the present invention with reference to the drawings.

Figure 1:
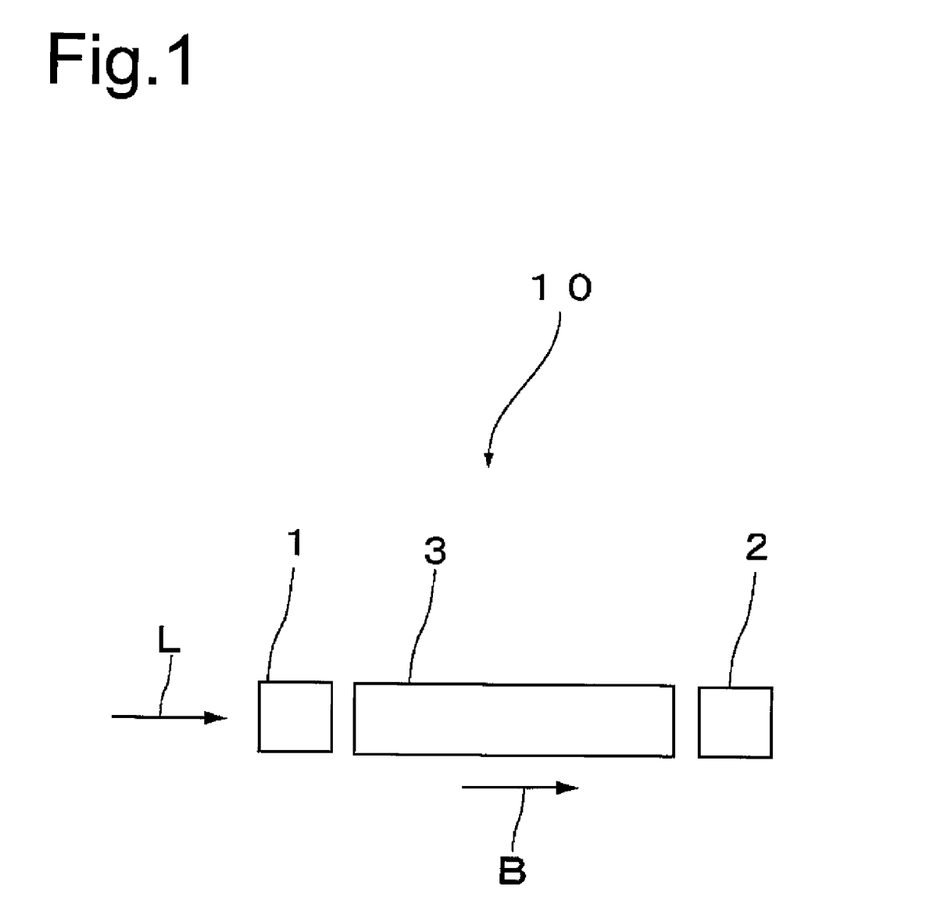
FIG. 1 is a schematic diagram showing an embodiment of an optical isolator according to the present invention.

FIG. 1 is a drawing showing an embodiment of an optical isolator of the present invention. As shown in FIG. 1, an optical isolator 10 is provided with a polarizer 1, an analyzer 2 and a Faraday rotator 3 arranged between the polarizer 1 and the analyzer 2. Here, the transmission axes of the polarizer 1 and the analyzer 2 are arranged so as to be mutually non-parallel, and are arranged so as to form an angle of, for example, 45°.

A magnetic field B is made to be applied to the Faraday rotator 3 in a direction moving from the polarizer 1 towards the analyzer 2, and the Faraday rotator 3 rotates the polarization plane of a light L that passes through the polarizer 1 and causes it to pass the transmission axis of the analyzer 2 due to application of the magnetic field B.

The following provides a detailed explanation of the Faraday rotator 3.

The Faraday rotator 3 is made of a terbium aluminum garnet single crystal. A portion of the aluminum is at least substituted with scandium, and a portion of at least one of the aluminum and terbium is substituted with at least one type selected from the group consisting of thulium, ytterbium and yttrium.

In addition, in the above-mentioned garnet single crystal, portions of the aluminum and the terbium are each preferably further substituted with at least one type selected from the group consisting of thulium, ytterbium and yttrium.

In this case, the garnet structure becomes more stable in comparison with the case of only a portion of either the aluminum or the terbium being substituted with at least one type selected from the group consisting of thulium, ytterbium and yttrium.

In addition, in the above-mentioned garnet single crystal, the terbium is preferably further substituted with scandium.

The above-mentioned garnet single crystal is preferably represented by the following general formula:

$$(Tb_{3-x-z}Sc_zM_x)(Sc_{2-y}M_y)Al_3O_{12} \quad (1)$$

(wherein, M represents at least one type selected from the group consisting of Tm, Yb and Y, and x, y and z satisfy the following relationships:

$0 < x+y \leq 0.30$, and $0 \leq z \leq 0.30$).

Here, the above-mentioned general formula (1) represents a terbium scandium aluminum garnet single crystal. In the above-mentioned general formula (1), the $(Sc_{2-y}M_y)$ moiety indicates that a portion of the Al is substituted with Sc or is substituted with Sc and M, or in other words, at least one type selected from the group consisting Tm, Yb and Y, while the $(Tb_{3-x-z}Sc_zM_x)$ moiety indicates that a portion of the Tb can be substituted with at least one of Sc and M.

According to the garnet single crystal represented by the above-mentioned general formula (1), the formation of cracks is adequately inhibited and a single crystal of good quality can be realized. Consequently, the garnet single crystal of the present invention is suitable for volume production and has adequate practicality. In addition, according to the above-mentioned single crystal, a garnet single crystal can also be realized that has high optical transmittance and demonstrates a large Faraday rotation angle over a broad wavelength range (400 nm to 1500 nm).

A single crystal having high optical transmittance over a broad wavelength range (400 nm to 1500 nm) as previously described is used for the Faraday rotator 3. Consequently, absorption of light attributable to the single crystal is reduced. Consequently, resistance to damage caused by light of the Faraday rotator 3 can be enhanced.

In addition, the above-mentioned single crystal has a large Faraday rotation angle at each wavelength over a broad wavelength range (400 nm to 1500 nm). Consequently, in the case of rotating the polarization plane of light by applying a constant magnetic field, the length of the Faraday rotator 3 along the direction in which the light progresses can be reduced, thereby making it possible to realize reduced size of the optical isolator 10.

Moreover, since the above-mentioned single crystal used as the Faraday rotator 3 is free of the formation of cracks, the frequency of the formation of cracks during handling is extremely low. Consequently, the service life of the optical isolator 10 can be prolonged.

In the above-mentioned general formula (1), M represents at least one type selected from the group consisting of Tm, Yb and Y. Namely, M may be Tm, Yb or Y alone or may be a combination of two or more types thereof.

In the above-mentioned general formula (1), x and y satisfy the following relationship:

$0 < x+y \leq 0.30$.

Here, although either x or y may be 0, if x+y is 0, this means that neither Tb nor Al is partially substituted with M, the garnet structure is not stabilized and there are cases in which cracks may form, thereby preventing the realization of a garnet single crystal of good quality.

In addition, if x+y is 0.30 or less, this means that the garnet structure becomes more stable and the formation of cracks is more adequately inhibited, thereby making it possible to realize a garnet single crystal of better quality.

Moreover, x and y preferably satisfy the following formula simultaneously:

$0 \leq x \leq 0.30$ $0 \leq y \leq 0.30$ $x < y$.

In this case, the garnet structure becomes more stable.

Here, x and y more preferably satisfy the following formula simultaneously:

$0 \leq x \leq 0.20$ $0 \leq y \leq 0.20$.

In the above-mentioned general formula (1), z satisfies the following formula of $0 \leq z \leq 0.30$. If z is within this range, in comparison with the case of z being outside this range, the garnet structure becomes more stable, the formation of cracks is more adequately inhibited, and a garnet single crystal of better quality can be realized.

Here, z preferably satisfies the following formula:

$$0 \leq z \leq 0.05$$

In this case, the garnet structure becomes more stable in comparison with the case of z being outside this range.

Furthermore, z may also be 0. In this case, Tb concentration becomes larger in comparison with the case of z being greater than 0, and as a result thereof, the Faraday rotation angle of the single crystal can be made to be larger. Here, z=0 means that a portion of the Tb is not substituted with Sc.

Moreover, when z=0, it is preferable that x=0. In this case, the Faraday rotation angle of the single crystal can be made to be even larger in comparison with the case of z=0 and x>0. Here, z=0 and x=0 means that the Tb is not substituted with either Sc or M.

In addition, in the above-mentioned general formula (1), x and z preferably satisfy the following formula simultaneously:

$$x > z.$$

In this case, the garnet structure becomes more stable in comparison with the case of x being equal to or less than z.

The following provides an explanation of a method for growing the above-mentioned single crystal.

Figure 2:
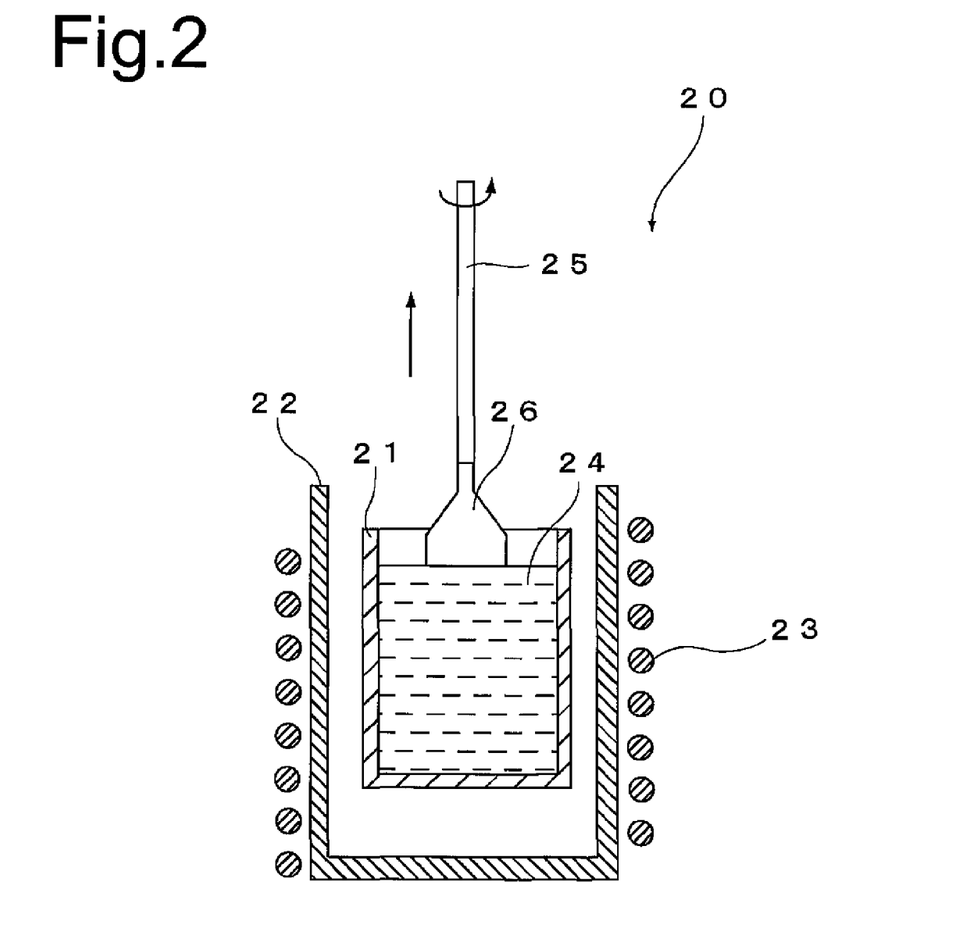
FIG. 2 is a process drawing showing a step for growing a garnet single crystal according to the present invention.

To begin with, prior to providing an explanation of the method for growing the above-mentioned single crystal, an explanation of a crystal growth apparatus for growing the above-mentioned single crystal is first provided with reference to FIG. 2. FIG. 2 is a process drawing showing a step for growing the garnet single crystal according to the present invention. As shown in FIG. 2, a crystal growth apparatus 20 is mainly provided with an iridium crucible 21, a cylindrical ceramic container 22 that houses the crucible 21, and a high-frequency coil 23 wound around the cylindrical container 22. The high-frequency coil 23 is used for heating the crucible 21 by generating an induced current in the crucible 21.

Next, an explanation is provided of the method for growing the above-mentioned single crystal using the above-mentioned crystal growth apparatus 20.

First, $Tb_4O_7$ powder, $Sc_2O_3$ powder and $Al_2O_3$ powder are prepared. An oxide of M is also prepared. Namely, $Tm_2O_3$ powder is prepared in the case M is Tm. In addition, $Yb_2O_3$ powder is prepared in the case M is Yb, and $Y_2O_3$ powder is prepared in the case M is Y. A powder of an oxide of two or more types of the elements Tm, Yb and Y may be prepared in the case M is formed of two or more types of these elements.

The formulation ratios of the $Tb_4O_7$ powder, $Sc_2O_3$ powder, $M_2O_3$ powder and $Al_2O_3$ powder are determined in order to obtain a single crystal having a composition as represented by the above-mentioned general formula (1). At this time, the formulation ratios of the $Tb_4O_7$ powder, $Sc_2O_3$ powder, $M_2O_3$ powder and $Al_2O_3$ powder are respectively as indicated below.

Namely, the formulation ratio of the $Tb_4O_7$ powder is normally 21.5 mol % to 23.5 mol % based on the total number of moles of the $Tb_4O_7$ powder, $Sc_2O_3$ powder, $M_2O_3$ powder and $Al_2O_3$ powder.

The formulation ratio of the $Sc_2O_3$ powder is normally 27.0 mol % to 31.0 mol % based on the total number of moles of the $Tb_4O_7$ powder, $Sc_2O_3$ powder, $M_2O_3$ powder and $Al_2O_3$ powder.

The formulation ratio of the $M_2O_3$ powder is 0.5 mol % to 5.0 mol % based on the total number of moles of the $Tb_4O_7$ powder, $Sc_2O_3$ powder, $M_2O_3$ powder and $Al_2O_3$ powder.

The formulation ratio of the $Al_2O_3$ powder is 45.0 mol % to 47.0 mol % based on the total number of moles of the $Tb_4O_7$ powder, $Sc_2O_3$ powder, $M_2O_3$ powder and $Al_2O_3$ powder.

The above-mentioned $Tb_4O_7$ powder, $Sc_2O_3$ powder, $M_2O_3$ powder and $Al_2O_3$ powder are then dry-mixed in the determined formulation ratios to obtain a mixed powder.

Next, the above-mentioned mixed powder is then packed into the crucible 21.

Continuing, when current is applied to the high-frequency coil 23, the crucible 21 is heated and the mixed powder within the crucible 21 is melted to obtain a melt 24. Continuing, a rod-shaped seed crystal 25 is prepared, and the pointed end of this seed crystal 25 is immersed in the melt 24 while rotating at a prescribed rotation speed followed by lifting out of the melt 24 at a prescribed lifting speed.

At this time, a garnet single crystal such as a yttrium aluminum garnet (YAG) single crystal can be used for the seed crystal 25.

In addition, the rotation speed of the seed crystal 25 is preferably 3 rpm to 50 rpm and more preferably 3 rpm to 10 rpm.

In addition, the lifting speed is preferably 0.1 mm/h to 3 mm/h and more preferably 0.2 mm/h to 1 mm/h.

In addition, the seed crystal 25 is preferably lifted in an inert gas atmosphere, and nitrogen is normally used for the inert gas. In addition, the seed crystal 25 is normally lifted under atmospheric pressure.

When the seed crystal 25 is lifted out of the melt 24 in this manner, a bulk single crystal 26 represented by the above-mentioned general formula (I) can be obtained on the end of the seed crystal 25.

Figure 3:
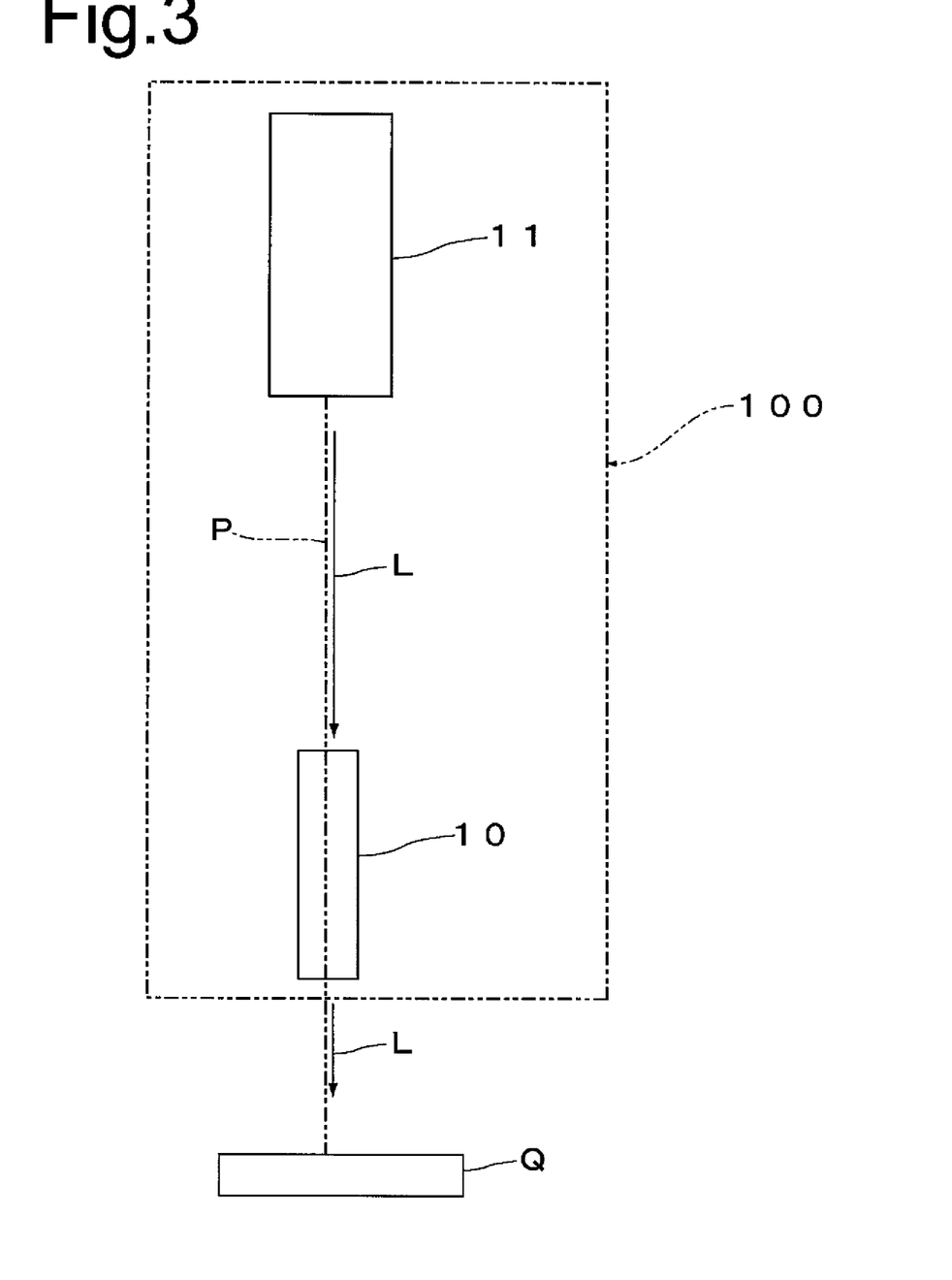
FIG. 3 is a schematic diagram showing an embodiment of an optical processor that uses the garnet single crystal according to the present invention.

Next, a detailed explanation is provided of the optical processor of the present invention with reference to FIG. 3. Furthermore, in FIG. 3, the same reference symbols are assigned to constituents that are the same or equivalent to those of FIG. 1, and duplicate explanations thereof are omitted.

FIG. 3 is a schematic diagram showing an embodiment of the optical processor of the present invention. As shown in FIG. 3, an optical processor 100 is provided with a laser light source 11 and the optical isolator 10 arranged in a light path P of laser light L emitted from the laser light source 11. Here, the optical isolator 10 has the Faraday rotator 3. According to this optical processor 100, the laser light L emitted from the laser light source 11 is emitted through the optical isolator 10, and a processed article Q can be processed by this emitted light.

Here, a garnet single crystal having high transmittance over a broad wavelength range (400 nm to 1500 nm) as previously described is used as the garnet single crystal used for the Faraday rotator 3 of the optical isolator 10. Consequently, decreases in optical output from the laser light source 11 can be adequately inhibited. In addition, since the single crystal has high optical transmittance, absorption of light attributable to the single crystal is low. Consequently, resistance to damage caused by light of the Faraday rotator 3 can be enhanced. Moreover, since the above-mentioned single crystal has high transmittance over a broad wavelength range, laser light sources of various oscillation wavelengths can be used for the laser light source 11 used.

Moreover, the above-mentioned garnet single crystal has a large Faraday rotation angle at each wavelength over a broad wavelength range (400 nm to 1500 nm). Consequently, in the case of rotating the polarization plane of light by applying a constant magnetic field, the length of the Faraday rotator 3 along the direction in which the light progresses can be reduced, thereby making it possible to realize reduced size of the optical isolator 10. Thus, reduced size of the optical processor 100 can also be realized.

Moreover, since the formation of cracks is adequately inhibited in the above-mentioned single crystal used for the Faraday rotator 3, the frequency of the formation of cracks during handling is extremely low. Consequently, the service life of the optical isolator 10 can be prolonged. As a result, the frequency at which the optical isolator 10 is replaced in the optical processor 100 can be reduced.

The above-mentioned single crystal has high transmittance at a wavelength of 1064 nm. Thus, the laser light source 11 is particularly preferably a laser light source having an oscillation wavelength of 1064 nm, such as an Nd:YAG laser. However, the above-mentioned single crystal also has high transmittance over a broad wavelength range. Consequently, a Yb-doped fiber laser having an oscillation wavelength of 1080 nm can also be used for the laser light source 11.

In addition, a laser light source having an oscillation wavelength of 400 nm to 700 nm can also be used. Examples of this type of laser light source include a GaN semiconductor laser having an oscillation wavelength of 405 nm and a titanium sapphire laser having an oscillation wavelength of 700 nm. Furthermore, according to the optical processor 100 provided with the laser light source 11 having an oscillation wavelength in the shortwave band in this manner, a cut portion of the processed article Q is not subjected to damage by heat, thereby allowing the obtaining of a smooth cross-sectional surface. In addition, the above-mentioned single crystal has adequately high transmittance even in the shortwave band (400 nm to 700 nm). Consequently, even if the oscillation wavelength of the laser light source 11 in the optical processor 100 is 400 nm to 700 nm, decreases in output attributable to the optical isolator 10 are adequately prevented.

The present invention is not limited to the previously described embodiments. For example, although as oscillation wavelengths of the laser light source 11, the range of 1064 nm or more or 400 nm to 700 nm is listed in the above-mentioned embodiments, the oscillation wavelength is not limited thereto. The oscillation wavelength of the laser light source 11 may also be within the range of 700 nm to 1064 nm, such as in the vicinity of 800 nm or within the range of 1030 nm to 1080 nm.

In addition, although the single crystal was used in an optical isolator of an optical processor in the above-mentioned embodiments, the single crystal is not limited to use in an optical isolator, but rather can also be applied to, for example, an optical magnetic field sensor which monitors changes in a magnetic field by measuring changes in Faraday rotation angle using a Faraday rotator.

EXAMPLES

Although the following provides a more specific explanation of the contents of the present invention by indicating examples thereof, the present invention is not limited to the following examples.

Example 1

First, $Tb_4O_7$ powder (purity: 99.99%), $Sc_2O_3$ powder (purity: 99.99%), $Al_2O_3$ powder (purity: 99.99%) and $Tm_2O_3$ powder (purity: 99.99%) were prepared and then dry-mixed to obtain a mixed powder. At this time, the formulation ratios of the $Tb_4O_7$ powder, $Sc_2O_3$ powder, $Tm_2O_3$ powder and $Al_2O_3$ powder were 22.8 mol %, 30.4 mol %, 0.8 mol % and 46.0 mol %, respectively, based on the total number of moles of the $Tb_4O_7$ powder, $Sc_2O_3$ powder, $Tm_2O_3$ powder and $Al_2O_3$ powder. Continuing, the mixed powder was packed into the cylindrical crucible 21 having a diameter of 50 mm and depth of 50 mm.

Continuing, the crucible 21 was heated by applying current to the high-frequency coil 23 to melt the mixed powder and obtain the melt 24. Continuing, a rod-shaped seed crystal 25 formed of YAG and measuring 3 mm×3 mm×70 mm was prepared, and the end of the seed crystal 25 was immersed in the melt 24 while the seed crystal 25 is rotated at a rotation speed of 10 rpm, and then lifted out at a lifting speed of 1 mm/h. At this time, nitrogen was allowed to flow into the cylindrical container 22 at a flow rate of 2 L/min, and lifting of the seed crystal 25 was conducted in a nitrogen atmosphere under atmospheric pressure.

A bulk single crystal having a diameter of 25 mm was obtained in this manner.

When the single crystal obtained in this manner was subjected to powder X-ray diffraction, a peak was confirmed for $Tb_3Sc_2Al_3O_{12}$. In addition, the single crystal was subjected to chemical analysis by inductively coupled plasma (ICP) to confirm the composition of the single crystal (atomic ratios of Tb, Sc, Tm, Al and O). Moreover, the structure of the resulting single crystal was analyzed by single crystal X-ray diffraction using Smart Apex manufactured by Bruker AXS K. K. From the above, a garnet single crystal was confirmed to have been obtained that is represented by the compositional formula $(Tb_{2.97}Sc_{0.01}Tm_{0.02})(Sc_{1.97}Tm_{0.03})Al_3O_{12}$.

Example 2

A single crystal was obtained in the same manner as Example 1 with the exception of setting the formulation ratios of the $Tb_4O_7$ powder, $Sc_2O_3$ powder, $Tm_2O_3$ powder and $Al_2O_3$ powder to 22.5 mol %, 30.0 mol %, 1.5 mol % and 46.0 mol %, respectively, based on the total number of moles of the $Tb_4O_7$ powder, $Sc_2O_3$ powder, $Tm_2O_3$ powder and $Al_2O_3$ powder. When the composition of the single crystal obtained in this manner was investigated in the same manner as Example 1, a garnet single crystal was confirmed to have been obtained that is represented by the compositional formula shown in Table 1.

Example 3

A single crystal was obtained in the same manner as Example 1 with the exception of setting the formulation ratios of the $Tb_4O_7$ powder, $Sc_2O_3$ powder, $Tm_2O_3$ powder and $Al_2O_3$ powder to 22.1 mol %, 29.0 mol %, 3.1 mol % and 45.8 mol %, respectively, based on the total number of moles of the $Tb_4O_7$ powder, $Sc_2O_3$ powder, $Tm_2O_3$ powder and $Al_2O_3$ powder. When the composition of the single crystal obtained in this manner was investigated in the same manner as Example 1, a garnet single crystal was confirmed to have been obtained that is represented by the compositional formula shown in Table 1.

Example 4

A single crystal was obtained in the same manner as Example 1 with the exception of setting the formulation ratios of the $Tb_4O_7$ powder, $Sc_2O_3$ powder, $Tm_2O_3$ powder and $Al_2O_3$ powder to 22.0 mol %, 27.7 mol %, 4.6 mol % and 45.7 mol %, respectively, based on the total number of moles of the $Tb_4O_7$ powder, $Sc_2O_3$ powder, $Tm_2O_3$ powder and $Al_2O_3$ powder. When the composition of the single crystal obtained in this manner was investigated in the same manner as Example 1, a garnet single crystal was confirmed to have been obtained that is represented by the compositional formula shown in Table 1.

Example 5

A single crystal was obtained in the same manner as Example 1 with the exception of using $Yb_2O_3$ powder instead of $Tm_2O_3$ powder, and setting the formulation ratios of the $Tb_4O_7$ powder, $Sc_2O_3$ powder, $Yb_2O_3$ powder and $Al_2O_3$ powder to 22.8 mol %, 30.4 mol %, 0.8 mol % and 46.0 mol %, respectively, based on the total number of moles of the $Tb_4O_7$ powder, $Sc_2O_3$ powder, $Yb_2O_3$ powder and $Al_2O_3$ powder. When the composition of the single crystal obtained in this manner was investigated in the same manner as Example 1, a garnet single crystal was confirmed to have been obtained that is represented by the compositional formula shown in Table 1.

Example 6

A single crystal was obtained in the same manner as Example 1 with the exception of using $Yb_2O_3$ powder instead of $Tm_2O_3$ powder, and setting the formulation ratios of the $Tb_4O_7$ powder, $Sc_2O_3$ powder, $Yb_2O_3$ powder and $Al_2O_3$ powder to 22.7 mol %, 29.8 mol %, 1.5 mol % and 46.0 mol %, respectively, based on the total number of moles of the $Tb_4O_7$ powder, $Sc_2O_3$ powder, $Yb_2O_3$ powder and $Al_2O_3$ powder. When the composition of the single crystal obtained in this manner was investigated in the same manner as Example 1, a garnet single crystal was confirmed to have been obtained that is represented by the compositional formula shown in Table 1.

Example 7

A single crystal was obtained in the same manner as Example 1 with the exception of using $Yb_2O_3$ powder instead of $Tm_2O_3$ powder, and setting the formulation ratios of the $Tb_4O_7$ powder, $Sc_2O_3$ powder, $Yb_2O_3$ powder and $Al_2O_3$ powder to 22.4 mol %, 28.6 mol %, 3.1 mol % and 45.9 mol %, respectively, based on the total number of moles of the $Tb_4O_7$ powder, $Sc_2O_3$ powder, $Yb_2O_3$ powder and $Al_2O_3$ powder. When the composition of the single crystal obtained in this manner was investigated in the same manner as Example 1, a garnet single crystal was confirmed to have been obtained that is represented by the compositional formula shown in Table 1.

Example 8

A single crystal was obtained in the same manner as Example 1 with the exception of using $Yb_2O_3$ powder instead of $Tm_2O_3$ powder, and setting the formulation ratios of the $Tb_4O_7$ powder, $Sc_2O_3$ powder, $Yb_2O_3$ powder and $Al_2O_3$ powder to 22.0 mol %, 27.6 mol %, 4.6 mol % and 45.8 mol %, respectively, based on the total number of moles of the $Tb_4O_7$ powder, $Sc_2O_3$ powder, $Yb_2O_3$ powder and $Al_2O_3$ powder. When the composition of the single crystal obtained in this manner was investigated in the same manner as Example 1, a garnet single crystal was confirmed to have been obtained that is represented by the compositional formula shown in Table 1.

Example 9

A single crystal was obtained in the same manner as Example 1 with the exception of using $Y_2O_3$ powder instead of $Tm_2O_3$ powder, and setting the formulation ratios of the $Tb_4O_7$ powder, $Sc_2O_3$ powder, $Y_2O_3$ powder and $Al_2O_3$ powder to 22.6 mol %, 29.9 mol %, 1.5 mol % and 46.0 mol %, respectively, based on the total number of moles of the $Tb_4O_7$ powder, $Sc_2O_3$ powder, $Y_2O_3$ powder and $Al_2O_3$ powder. When the composition of the single crystal obtained in this manner was investigated in the same manner as Example 1, a garnet single crystal was confirmed to have been obtained that is represented by the compositional formula shown in Table 1.

Example 10

A single crystal was obtained in the same manner as Example 1 with the exception of using $Y_2O_3$ powder instead of $Tm_2O_3$ powder, and setting the formulation ratios of the $Tb_4O_7$ powder, $Sc_2O_3$ powder, $Y_2O_3$ powder and $Al_2O_3$ powder to 21.8 mol %, 28.0 mol %, 4.5 mol % and 45.7 mol %, respectively, based on the total number of moles of the $Tb_4O_7$ powder, $Sc_2O_3$ powder, $Y_2O_3$ powder and $Al_2O_3$ powder. When the composition of the single crystal obtained in this manner was investigated in the same manner as Example 1, a garnet single crystal was confirmed to have been obtained that is represented by the compositional formula shown in Table 1.

Comparative Example 1

A single crystal was obtained in the same manner as Example 1 with the exception of not using $Tm_2O_3$ powder, and setting the formulation ratios of the $Tb_4O_7$ powder, $Sc_2O_3$ powder and $Al_2O_3$ powder to 23.0 mol %, 30.9 mol % and 46.1 mol %, respectively, based on the total number of moles of the $Tb_4O_7$ powder, $Sc_2O_3$ powder and $Al_2O_3$ powder. When the composition of the single crystal obtained in this manner was investigated in the same manner as Example 1, a garnet single crystal was confirmed to have been obtained that is represented by the compositional formula shown in Table 1.

Comparative Example 2

A single crystal was obtained in the same manner as Example 1 with the exception of not using $Tm_2O_3$ powder, and setting the formulation ratios of the $Tb_4O_7$ powder, $Sc_2O_3$ powder and $Al_2O_3$ powder to 22.1 mol %, 32.1 mol % and 45.8 mol %, respectively, based on the total number of moles of the $Tb_4O_7$ powder, $Sc_2O_3$ powder and $Al_2O_3$ powder. When the composition of the single crystal obtained in this manner was investigated in the same manner as Example 1, a garnet single crystal was confirmed to have been obtained that is represented by the compositional formula shown in Table 1.

[Evaluation of Properties]

The properties of the garnet single crystals of Examples 1 to 10 and Comparative Examples 1 and 2 obtained in the manner described above were investigated as described below.

(1) Presence of Cracks

The single crystals of Examples 1 to 10 and Comparative Examples 1 and 2 were visually investigated for the presence of cracks. The results are shown in Table 1.

(2) Transmittance

Transmittance of the single crystals of Examples 1 to 10 and Comparative Examples 1 and 2 was measured at wavelengths of 405 nm, 633 nm, 1064 nm and 1500 nm. The results are shown in Table 1.

(3) Faraday Rotation Angle

An analyzer was first rotated without arranging a single crystal between the polarizer and analyzer to create a quenched state. Next, the single crystals of Examples 1 to 10 and Comparative Examples 1 and 2 were cut into the shapes of square bars measuring 3.5 mm×3.5 mm×20 mm, each single crystal was arranged between the polarizer and analyzer, light was introduced while applying a magnetic flux density of 0.42 T along the longitudinal direction of the single crystal, and the analyzer was again rotated to create a quenched state. The difference between the rotation angle of the analyzer prior to placing the single crystal between the polarizer and analyzer and the rotation angle of the analyzer after placing the single crystal between the polarizer and analyzer was calculated, and the difference in angles was taken to be the Faraday rotation angle of that single crystal. At this time, Faraday rotation angles were respectively measured while changing the wavelength of the light source to 633 nm, 1064 nm and 1303 nm. The results are shown in Table 1.

Faraday rotation angle was unable to be measured for the single crystals of Comparative Examples 1 and 2 due to the formation of large cracks.

On the basis of the above results, the garnet single crystal of the present invention was confirmed to become a single crystal of good quality, have high transmittance over a broad wavelength range, and demonstrate a large Faraday rotation angle over a broad wavelength range.

INDUSTRIAL APPLICABILITY

The garnet single crystal of the present invention is a single crystal of good quality, has high transmittance over a broad wavelength range, and demonstrates a large Faraday rotation angle over a broad wavelength range. Thus, the garnet single

TABLE 1

| | Compositional Formula | x + y | x | y | z | Evaluation of Properties Cracks |
|---|---|---|---|---|---|---|
| Ex. 1 | $(Tb_{2.97}Sc_{0.01}Tm_{0.02})(Sc_{1.97}Tm_{0.03})Al_3O_{12}$ | 0.05 | 0.02 | 0.03 | 0.01 | Absent |
| Ex. 2 | $(Tb_{2.94}Sc_{0.02}Tm_{0.04})(Sc_{1.94}Tm_{0.06})Al_3O_{12}$ | 0.10 | 0.04 | 0.06 | 0.02 | Absent |
| Ex. 3 | $(Tb_{2.9}Sc_{0.03}Tm_{0.07})(Sc_{1.87}Tm_{0.13})Al_3O_{12}$ | 0.20 | 0.07 | 0.13 | 0.03 | Absent |
| Ex. 4 | $(Tb_{2.88}Sc_{0.02}Tm_{0.1})(Sc_{1.8}Tm_{0.2})Al_3O_{12}$ | 0.30 | 0.10 | 0.20 | 0.02 | Absent |
| Ex. 5 | $(Tb_{2.97}Sc_{0.01}Yb_{0.02})(Sc_{1.97}Yb_{0.03})Al_3O_{12}$ | 0.05 | 0.02 | 0.03 | 0.01 | Absent |
| Ex. 6 | $(Tb_{2.96}Sc_{0.01}Yb_{0.03})(Sc_{1.93}Yb_{0.07})Al_3O_{12}$ | 0.10 | 0.03 | 0.07 | 0.01 | Absent |
| Ex. 7 | $(Tb_{2.93}Sc_{0.02}Yb_{0.05})(Sc_{1.85}Yb_{0.15})Al_3O_{12}$ | 0.20 | 0.05 | 0.15 | 0.02 | Absent |
| Ex. 8 | $(Tb_{2.89}Sc_{0.02}Yb_{0.09})(Sc_{1.79}Yb_{0.21})Al_3O_{12}$ | 0.30 | 0.09 | 0.21 | 0.02 | Absent |
| Ex. 9 | $(Tb_{2.95}Sc_{0.01}Y_{0.04})(Sc_{1.94}Y_{0.06})Al_3O_{12}$ | 0.10 | 0.04 | 0.06 | 0.01 | Absent |
| Ex. 10 | $(Tb_{2.86}Sc_{0.02}Y_{0.12})(Sc_{1.82}Y_{0.18})Al_3O_{12}$ | 0.30 | 0.12 | 0.18 | 0.02 | Absent |
| Comp. Ex. 1 | $(Tb_{2.99}Sc_{0.01})Sc_2Al_3O_{12}$ | 0 | 0 | 0 | 0.01 | Present |
| Comp. Ex. 2 | $(Tb_{2.9}Sc_{0.1})Sc_2Al_3O_{12}$ | 0 | 0 | 0 | 0.10 | Present |

| | Evaluation of Properties | | | | | | |
|---|---|---|---|---|---|---|---|
| | Transmittance (%) | | | | Faraday rotation angle (°) | | |
| | 405 nm | 633 nm | 1064 nm | 1500 nm | 633 nm | 1064 nm | 1303 nm |
| Ex. 1 | 79.6 | 83.0 | 85.2 | 80.6 | 73.7 | 20.9 | 12.9 |
| Ex. 2 | 80.3 | 82.6 | 85.5 | 80.5 | 78.7 | 23.2 | 15.7 |
| Ex. 3 | 80.0 | 82.3 | 84.7 | 80.3 | 70.5 | 21.2 | 13.0 |
| Ex. 4 | 80.3 | 82.7 | 85.0 | 80.1 | 73.5 | 20.5 | 13.2 |
| Ex. 5 | 80.1 | 83.2 | 85.2 | 80.6 | 74.2 | 22.2 | 13.4 |
| Ex. 6 | 79.5 | 82.9 | 84.2 | 80.5 | 75.3 | 23.0 | 14.8 |
| Ex. 7 | 79.1 | 81.5 | 83.5 | 80.3 | 73.6 | 22.5 | 13.1 |
| Ex. 8 | 78.7 | 81.3 | 83.2 | 80.1 | 74.9 | 22.6 | 14.5 |
| Ex. 9 | 78.7 | 82.8 | 85.1 | 79.5 | 74.2 | 21.8 | 14.1 |
| Ex. 10 | 78.1 | 82.5 | 83.4 | 79.3 | 73.6 | 21.5 | 13.7 |
| Comp. Ex. 1 | Unmeasurable | Unmeasurable | Unmeasurable | Unmeasurable | Unmeasurable | Unmeasurable | Unmeasurable |
| Comp. Ex. 2 | Unmeasurable | Unmeasurable | Unmeasurable | Unmeasurable | Unmeasurable | Unmeasurable | Unmeasurable |

According to the results shown in Table 1, it was found that the garnet single crystals of Examples 1 to 10 were free of crack formation. In contrast, it was found that large cracks formed in the garnet single crystals of Comparative Examples 1 and 2.

In addition, it was found that the single crystals of Examples 1 to 10 had high transmittance over all wavelength ranges of 405 nm, 633 nm, 1064 nm and 1500 nm. In contrast, transmittance was unable to be measured for the single crystals of Comparative Examples 1 and 2 due to the formation of large cracks.

Moreover, it was found that the single crystals of Examples 1 to 10 had large Faraday rotation angles for each of the wavelengths of 633 nm, 1064 nm and 1303 nm. In contrast, crystal of the present invention can be preferably used as a Faraday rotator of an optical isolator used in a light source device for optical processors and optical communications.

EXPLANATION OF REFERENCE NUMERALS

1: Polarizer
2: Analyzer
3: Faraday rotator
10: Optical isolator
11: Laser light source
100: Optical processor

The invention claimed is:

1. A garnet single crystal comprising a terbium aluminum garnet single crystal,
wherein a portion of the aluminum is at least substituted with scandium and at least one type selected from the group consisting of thulium, ytterbium and yttrium, and a portion of the terbium is substituted with scandium and at least one type selected from the group consisting of thulium, ytterbium and yttrium;
which is represented by the following general formula:

$$(Tb_{3-x-z}Sc_zM_x)(Sc_{2-y}M_y)Al_3O_{12} \quad (1)$$

wherein, M represents at least one type selected from the group consisting of Tm, Yb and Y, and x, y and z satisfy the following formulas simultaneously:

$0.02 \leq x \leq 0.12$ $0.03 \leq y \leq 0.21$ $0.01 \leq z \leq 0.03$ $0.05 \leq x+y \leq 0.30$.

2. The garnet single crystal according to claim 1, wherein x and y satisfy the following formula:

$x < y$.

3. The garnet single crystal according to claim 1, wherein x and z satisfy the following formula:

$x > z$.

4. The garnet single crystal according to claim 1, which is used as a Faraday rotator.

5. An optical isolator having a Faraday rotator,
wherein the Faraday rotator is formed of the garnet single crystal according to claim 4.

6. An optical processor comprising:
a laser light source; and
an optical isolator arranged in a light path of laser light emitted from the laser light source,
wherein the optical isolator is the optical isolator according to claim 5.

7. The optical processor according to claim 6, wherein an oscillation wavelength of the laser light source is 1064 nm.

* * * * *